(12) United States Patent
Sandhu et al.

(10) Patent No.: US 7,749,837 B2
(45) Date of Patent: Jul. 6, 2010

(54) HIGH COUPLING MEMORY CELL

(75) Inventors: Sukesh Sandhu, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 184 days.

(21) Appl. No.: 11/486,618

(22) Filed: Jul. 14, 2006

(65) Prior Publication Data

US 2006/0258095 A1 Nov. 16, 2006

Related U.S. Application Data

(62) Division of application No. 10/899,913, filed on Jul. 27, 2004, now Pat. No. 7,396,720.

(51) Int. Cl.
*H01L 21/336* (2006.01)

(52) U.S. Cl. .................. 438/260; 257/315; 257/E21.68

(58) Field of Classification Search .................. 438/201, 438/211, 257–259, 261, 267, 294, 296, 424, 438/260; 257/315, 321, 506, 510, E21.68
See application file for complete search history.

(56) References Cited

U.S. PATENT DOCUMENTS

| 5,556,799 | A | | 9/1996 | Hong | |
|---|---|---|---|---|---|
| 5,840,607 | A | * | 11/1998 | Yeh et al. | 438/257 |
| 6,355,527 | B1 | | 3/2002 | Lin | |
| 6,376,877 | B1 | * | 4/2002 | Yu et al. | 257/317 |
| 6,380,583 | B1 | | 4/2002 | Hsieh | |
| 6,391,722 | B1 | | 5/2002 | Koh | |
| 6,498,064 | B2 | * | 12/2002 | Tseng | 438/257 |
| 6,531,733 | B1 | | 3/2003 | Jang | |
| 6,677,201 | B1 | | 1/2004 | Bu | |
| 6,677,640 | B1 | | 1/2004 | Sandhu | |
| 6,720,611 | B2 | | 4/2004 | Jang | |
| 6,724,036 | B1 | | 4/2004 | Hsieh | |
| 6,844,231 | B2 | * | 1/2005 | Kim et al. | 438/257 |
| 2003/0119256 | A1 | * | 6/2003 | Dong et al. | 438/257 |

* cited by examiner

*Primary Examiner*—David Vu
(74) *Attorney, Agent, or Firm*—Leffert Jay & Polglaze, P.A.

(57) ABSTRACT

A first dielectric layer is formed over a substrate. A single layer first conductive layer that acts as a floating gate is formed over the first dielectric layer. A trough is formed in the first conductive layer to increase the capacitive coupling of the floating gate with a control gate. An intergate dielectric layer is formed over the floating gate layer. A second conductive layer is formed over the second dielectric layer to act as a control gate.

18 Claims, 3 Drawing Sheets

US 7,749,837 B2

HIGH COUPLING MEMORY CELL

RELATED APPLICATION

This Application is a Divisional of U.S. application Ser. No. 10/899,913, titled "HIGH COUPLING MEMORY CELL," filed Jul. 27, 2004, now U.S. Pat. No. 7,396,720 which is commonly assigned and incorporated herein by reference.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The performance and density of flash memory devices need to improve as the performance of computer systems increase. For example, a flash memory transistor that can be programmed faster with greater reliability could increase system performance. One way to increase performance and increase memory density is to reduce the size of the memory cell.

One problem, however, with decreasing cell component dimensions is that the surface area of the cell's floating gate also decreases. This leads to a decrease in the capacitance of the effective capacitor formed between the floating gate layer and the control gate layer. The decrease in effective capacitance results in a reduction of the capacitive coupling ratio. The poorly coupled voltage to floating gate limits the programming and accessing speed characteristics of the memory device.

For the reasons stated above, and for other reasons stated below which will become apparent to those skilled in the art upon reading and understanding the present specification, there is a need in the art for a way to decrease memory cell dimensions without degrading cell performance.

DETAILED DESCRIPTION

Figure 1:
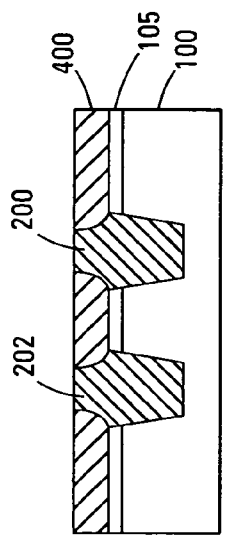
FIG. 1 shows a cross-sectional view of one embodiment of one or more steps in fabricating the high coupling memory cell of the present invention.
Figure 2:
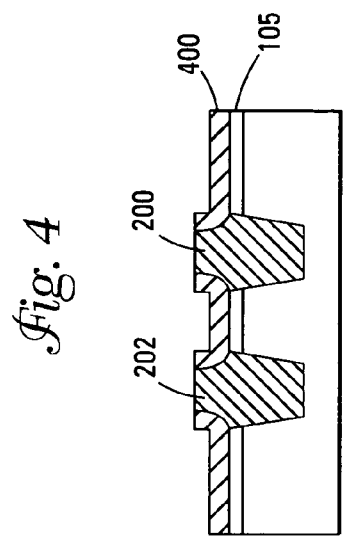
FIG. 2 shows a cross-sectional view of one embodiment of one or more steps in fabricating the high coupling memory cell of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 illustrates a cross-sectional view of one embodiment for fabrication of high coupling memory cells of the present invention. In this figure, a sacrificial pad oxide layer 102 is formed over a semiconductor substrate 100. In one embodiment, the pad oxide layer 102 is a silicon oxide material that may be formed by thermal oxidation, low pressure chemical vapor deposition (LPCVD), or some other process. A mask layer 104 is formed over the pad oxide layer 102. In one embodiment, this layer 104 is a silicon nitride mask that can be formed by reacting dichlorosilane with ammonia through an LPCVD process. Alternate embodiments can use other mask materials formed by alternate processes.

Shallow trench isolation (STI), in one embodiment, separates the active areas 210-212 of the cells with trenches 200 and 202. The mask layer 104 provides for a raised, insulator filler in the trenches. In one embodiment, the trenches 200 and 202 are filled with an oxide dielectric material. The trenches 200 and 202 may be filled using high-density plasma deposition, LPCVD, or some other method. Excess oxide outside the trenches 200 and 202 can be removed by an etch back or chemical mechanical polishing (CMP) process, using the mask layer 104 as a polishing stop layer.

Figure 3:
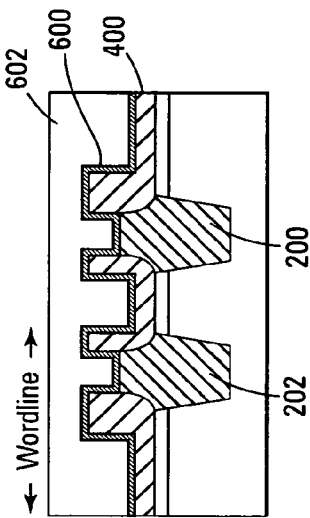
FIG. 3 shows a cross-sectional view of one embodiment of one or more steps in fabricating the high coupling memory cell of the present invention.

The sacrificial nitride mask 104 is removed in FIG. 3 to expose the pad oxide 102 and protruding oxide isolation areas

200 and 202. The sacrificial pad oxide 102 can then go through an isotropic oxide strip process to remove pad oxide material.

The isotropic oxide strip process also widens the area by narrowing the upper portions of the protruding oxide isolation areas 200 and 202 to form the shapes illustrated. This widens the area for the subsequent floating gate layer 400. In one embodiment, each side of the upper portions of the protruding oxide isolation areas 200 and 202 take on a substantially concave shape after the isotropic oxide strip process.

Figure 4:
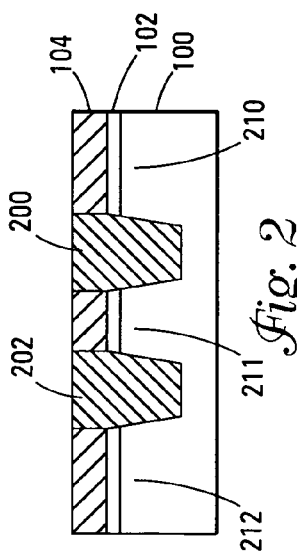
FIG. 4 shows a cross-sectional view of one embodiment of one or more steps in fabricating the high coupling memory cell of the present invention.
Figure 5:
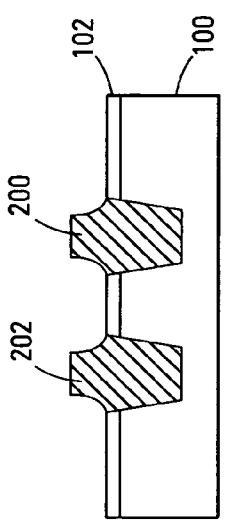
FIG. 5 shows a cross-sectional view of one embodiment of one or more steps in fabricating the high coupling memory cell of the present invention.

A gate oxide layer 105 is then formed over the substrate 100 as illustrated in FIG. 4. This layer 105 may also be referred to as the tunnel dielectric layer 105.

The floating gate 400 is a conductive layer that is formed on the tunnel dielectric layer 105, as illustrated in FIG. 4. The floating gate 400 may be formed as one or more layers of doped polysilicon. In one embodiment, the floating gate 400 is a single layer of insitu doped polysilicon or other conductive material. The floating gate 400 may be formed by a deposition process such that stops at the tops of the upper portions of the oxide isolation areas 200 and 202. In one embodiment, an LPCVD method employing silane as the silicon source material can be used to deposit the floating gate 400. A CMP process is used on the floating gate layer 400 to planerize. Alternate embodiments may use other processes. The single layer process provides less steps in the fabrication process in order to save fabrication time and also requires fewer consumables to fabricate.

A pattern is then formed over the floating gate layer 400 with an etch resist. The floating gate layer 400 is then etched to generate troughs in the floating gate. This step creates additional surface area in the floating gate to increase the capacitive coupling of the floating gate 400 to the control gate. The etch timing determines the depth of the troughs. In one embodiment, the troughs are 50% of the thickness of the floating gate layer. The embodiments of the present invention, however, are not limited to any one depth for the troughs.

Figure 6:
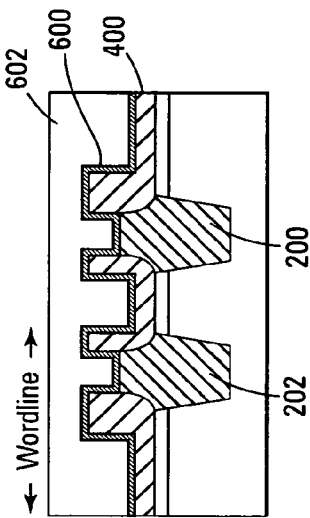
FIG. 6 shows a cross-sectional view of one embodiment of one or more steps in fabricating the high coupling memory cell of the present invention.

The tops of the isolation areas 200 and 202 are also etched so that the oxide material is lowered below the surface of the floating gate layer 400, as illustrated in FIG. 6. In one embodiment, the upper portion oxide of the isolation areas 200 and 202 is removed such that the oxide extends through 50% of the thickness of the floating gate layer 400. The embodiments of the present invention, however, are not limited to any one percentage of extension of the oxide isolation areas 200 and 202 through the floating gate layer 400.

FIG. 6 further illustrates that an intergate dielectric layer 600 is formed over the floating gate 400. This layer 600 may be an oxide-nitride-oxide (ONO) layer, a nitride-oxide (NO) layer, or some other dielectric layer.

Another conductive layer 602 is formed over the dielectric layer 600 to act as the control gate for the memory cell. This layer 600 can be a doped polysilicon material and may contain more than one conductive material such as a polysilicon/silicide/metal structure. The control gate layer 600 is part of a wordline of a memory array. In the embodiment illustrated in FIG. 6, the wordline of the memory array extends laterally across the figure as shown.

Figure 7:
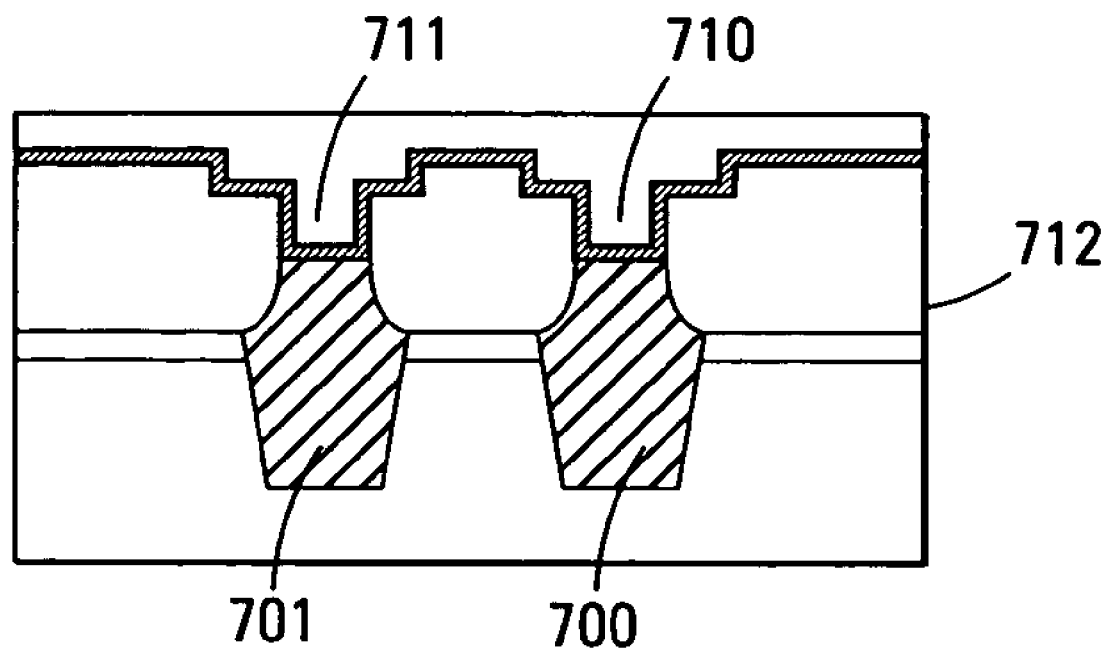
FIG. 7 shows a cross-sectional view of another embodiment of a high coupling memory cell of the present invention.

FIG. 7 illustrates an alternate embodiment of a high coupling memory cell of the present invention. This embodiment alters the floating gate etching step previously discussed in order to form a multi-level trough 710 and 711 in the floating gate 712 over the oxide isolation areas 700 and 701.

This embodiment can be fabricated by performing multiple etch processes, substantially similar to that discussed previously, to produce the multi-level floating gate over the active areas. The oxide isolation areas are then etched to reduce the oxide material below the surface of the floating gate layer 712. The multi-level embodiment of the present invention provides a greatly increased surface area for the floating gate, thus increasing the capacitive coupling of the memory cell.

The embodiment of FIG. 7 shows two levels being etched into the floating gate 712. However, the embodiments of the present invention are not limited to any certain quantity of levels to increase the floating gate surface area to enhance its coupling to the control gate.

The embodiments of the high coupling memory cell of the present invention are illustrated in a flash memory cell. The flash memory cell can be part of a NAND-architecture flash memory array, a NOR-architecture flash memory array, or any other type of flash memory array. The embodiments of the present invention are not limited to non-volatile memory cells. Any memory cell requiring high capacitive coupling between various layers are encompassed by the present invention.

Figure 8:
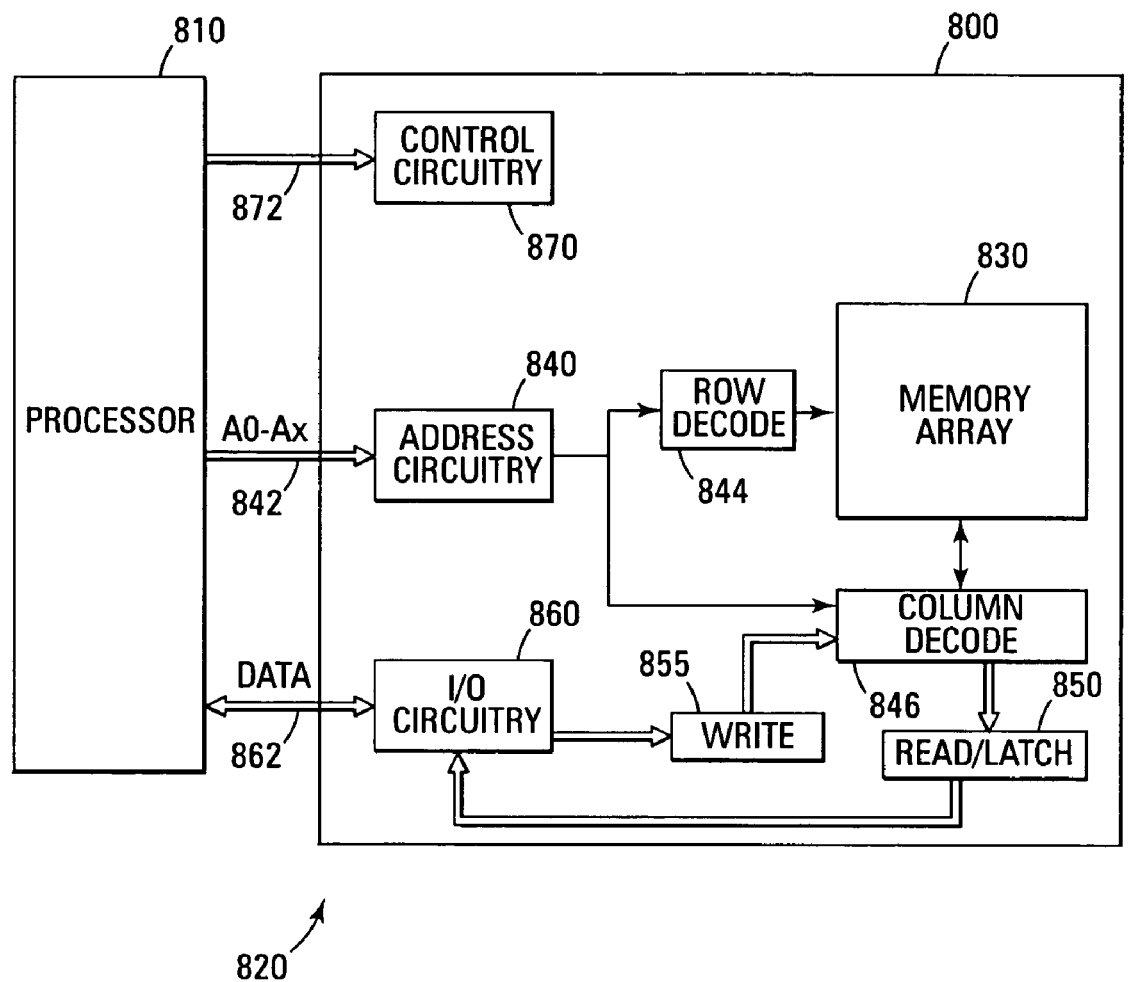
FIG. 8 shows a block diagram for one embodiment of an electronic system of the present invention.

FIG. 8 illustrates a functional block diagram of a memory device 800 that can incorporate the flash memory cells of the present invention. The memory device 800 is coupled to a processor 810. The processor 810 may be a microprocessor or some other type of controlling circuitry that generates memory control signals. The memory device 800 and the processor 810 form part of a memory system 820. The memory device 800 has been simplified to focus on features of the memory that are helpful in understanding the present invention.

The memory device includes an array of flash memory cells 830. The memory array 830 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture as well as other architectures.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense amplifier/buffer circuitry 850. The sense amplifier/buffer circuitry, in one embodiment, is coupled to read and latch a row of data from the memory array 830. Data input and output buffer circuitry 860 is included for bi-directional data communication over a plurality of data connections 862 with the controller 810. Write circuitry 855 is provided to write data to the memory array.

Control circuitry 870 decodes signals provided on control connections 872 from the processor 810. These signals are used to control the operations on the memory array 830, including data read, data write, and erase operations. The control circuitry 870 may be a state machine, a sequencer, or some other type of controller.

The flash memory device illustrated in FIG. 8 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

CONCLUSION

In summary, the embodiments of the present invention increase the capacitive coupling of a floating gate to a control gate in a memory cell. This is accomplished without increasing the size of the memory cell. By etching vertical troughs having one or more levels into the floating gate, the surface area of the floating gate is increased, thereby increasing the capacitive coupling with the control gate. The increased capacitive coupling increases the programming and access performance of the cell.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating a memory cell in a memory array, the method comprising:
    forming a tunnel dielectric layer over a substrate;
    forming a plurality of isolation trenches in the tunnel dielectric layer and substrate, each isolation trench filled with an oxide dielectric having an upper portion that extends above the tunnel dielectric layer;
    forming a substantially concave shape on each side of the upper portion of each oxide dielectric using an isotropic strip process;
    forming a single layer floating gate over the tunnel dielectric layer and around the upper portions;
    etching the floating gate to form multi-level troughs in the floating gate substantially above each concave shape of each upper portion;
    forming an intergate dielectric layer over the floating gate that is composed of a nitride-oxide; and
    forming a control gate over the intergate dielectric layer wherein the control gate is composed of a polysilicon/silicide/metal structure.

2. The method of claim 1 wherein the plurality of isolation trenches separate active areas of the memory cell.

3. The method of claim 1 and further including:
    forming a pad oxide layer over the substrate; and
    removing the pad oxide with an isotropic strip process.

4. The method of claim 3 and further including forming a mask layer over the pad oxide layer such that the mask layer is a sacrificial layer that operates as a polishing stop layer during a chemical mechanical polishing process.

5. The method of claim 1 wherein the floating gate and control gate are doped polysilicon.

6. The method of claim 1 wherein the floating gate is an insitu doped polysilicon.

7. The method of claim 1 and further including coupling the control gate to a wordline of the memory array.

8. The method of claim 1 wherein the single layer floating gate is formed by a deposition process.

9. The method of claim 8 wherein the deposition process is a low pressure chemical vapor deposition process.

10. The method of claim 8 wherein the deposition process is a low pressure chemical vapor deposition process employing silane as silicon source material.

11. A method for fabricating a memory cell, the method comprising:
    forming a pad oxide layer over a substrate;
    forming a nitride mask layer over the pad oxide layer;
    performing a shallow trench isolation process to create isolation trenches in the substrate through the nitride mask layer and the pad oxide layer, the isolation trenches filled with an oxide dielectric with an upper portion that extends above the pad oxide layer and is substantially level with the top of the nitride mask layer;
    removing the nitride mask layer;
    using an isotropic strip process to remove the pad oxide layer and narrow the upper portions to form a substantially concave shape on each side of each upper portion;
    forming a gate oxide layer over the substrate and around the upper portions;
    forming a single layer floating gate layer over the gate oxide layer and around the upper portions;
    etching the floating gate layer to form at least one multi-level trough in the floating gate layer over each concave shape of each oxide dielectric of the isolation trenches;
    forming an intergate dielectric layer, composed of a nitride-oxide, over the floating gate layer; and
    forming a control gate over the intergate dielectric layer wherein the control gate is composed of a polysilicon/silicide/metal structure.

12. The method of claim 11 wherein the nitride mask layer is formed by a low pressure chemical vapor deposition process.

13. The method of claim 12 wherein the low pressure chemical vapor deposition process reacts dichlorosilane with ammonia to generate silicon nitride.

14. The method of claim 11 wherein forming the single layer floating gate comprises an insitu doped polysilicon that is deposited by a low pressure chemical vapor deposition method employing silane as a silicon source material.

15. A method for fabricating a memory cell, the method comprising:
    forming a tunnel dielectric over a substrate;
    forming a plurality of isolation trenches in the tunnel dielectric and substrate, each isolation trench filled with an oxide dielectric having an upper portion that extends above the tunnel dielectric;
    forming a substantially concave shape on each side of the upper portion;
    forming a single layer floating gate over the tunnel dielectric and around the upper portions;
    etching the floating gate to form multi-level troughs in the floating gate substantially above each concave shape;
    forming an intergate dielectric over the floating gate, the intergate dielectric composed of a nitride-oxide; and
    forming a control gate over the intergate dielectric.

16. The method of claim 15 and further including:
    forming a pad oxide layer over the substrate; and
    removing the pad oxide while forming the substantially concave shape on each side of the upper portion.

17. The method of claim 16 and further including forming a mask layer over the pad oxide layer such that the mask layer is a sacrificial layer.

18. The method of claim 15 and further including forming a word line of a memory array on the control gate.

* * * * *